Figure 1:
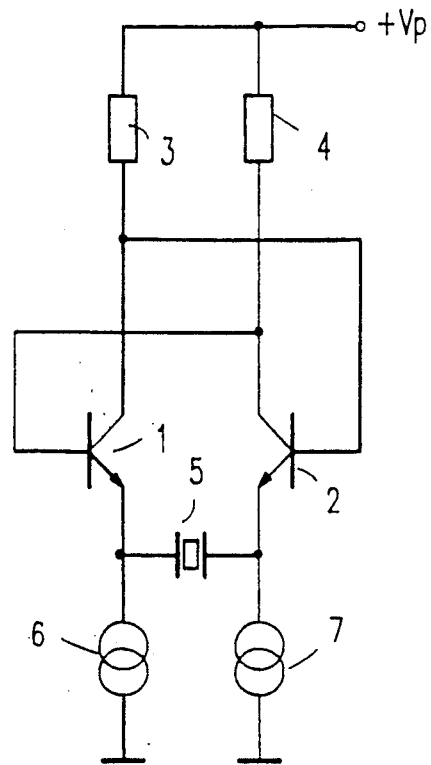

United States Patent [19]
Kohsiek

[11] Patent Number: 5,081,430
[45] Date of Patent: Jan. 14, 1992

[54] OVERTONE CRYSTAL OSCILLATOR HAVING RESONANCE AMPLIFIER IN FEEDBACK PATH

[75] Inventor: Cord H. Kohsiek, Ellerau, Fed. Rep. of Germany

[73] Assignee: U.S. Philips Corporation, New York, N.Y.

[21] Appl. No.: 610,601

[22] Filed: Nov. 8, 1990

[30] Foreign Application Priority Data

Nov. 16, 1989 [DE] Fed. Rep. of Germany ....... 3938095

[51] Int. Cl.$^5$ ............................................. H03B 5/36
[52] U.S. Cl. ................................ 331/116 R; 331/158; 331/113 R
[58] Field of Search ............ 331/116 R, 116 FE, 158, 331/159, 113 R

[56] References Cited

U.S. PATENT DOCUMENTS

| | | | |
|---|---|---|---|
| 3,684,981 | 8/1972 | Kreitz | 331/116 R |
| 4,139,826 | 2/1979 | Pradal | 331/116 R |
| 4,353,039 | 10/1982 | Huntley | 331/116 R X |
| 4,959,624 | 9/1990 | Higgins, Jr. et al. | 331/116 R |

Primary Examiner—Siegfried H. Grimm
Attorney, Agent, or Firm—William Squire

[57] ABSTRACT

In an overtone crystal oscillator comprising a crystal oscillator having a feedback loop and a resonance amplifier whose amplitude characteristic has an overshoot in the range of the resonant frequency of the resonance amplifier and which is arranged in the feedback loop of the crystal oscillator, the resonant frequency of the resonance amplifier is between the frequency of the overtone to be generated and the next lower oscillation frequency of the crystal oscillator, while signals in the frequency range of the next lower oscillation frequency(ies) in relation to signals in the frequency range of the overtone to be generated in the feedback loop, particularly in the resonance amplifier, have such a phase shift that the overtone crystal oscillator cannot oscillate at the frequencies of the next lower oscillation frequency(ies) and that it only oscillates at the frequency of the overtone to be generated.

7 Claims, 2 Drawing Sheets

OVERTONE CRYSTAL OSCILLATOR HAVING RESONANCE AMPLIFIER IN FEEDBACK PATH

The invention relates to an overtone crystal oscillator comprising a crystal oscillator having a feedback loop and a resonance amplifier whose amplitude characteristic has an overshoot in the range of the resonant frequency of the resonance amplifier and which is arranged in the feedback loop of the crystal oscillator.

Such overtone crystal oscillators, as are known, for example, from the journal Funkschau, vol. 21, 1982, pp. 81 and 82, generally comprise resonance amplifiers having both capacitances and inductances. The resonant frequency of this amplifier is such that it coincides with the frequency of the desired harmonic of the crystal oscillator. Thus, the overshoot in the amplitude characteristic in the range of the resonant frequency of the resonance amplifier is utilized. In order that the resonant frequency exactly coincides with the desired harmonic of the crystal oscillator, an exact adjustment of the resonant frequency of the resonance amplifier is necessary.

It is an object of the invention to provide a further overtone crystal oscillator of the type described in the opening paragraph.

According to the invention this object is achieved in that the resonant frequency of the resonance amplifier is between the frequency of the overtone to be generated and the next lower oscillation frequency of the crystal oscillator and in that signals in the frequency range of the next lower oscillation frequency(ies) in relation to signals in the frequency range of the overtone to be generated in the feedback loop, particularly in the resonance amplifier, have such a phase shift that the overtone crystal oscillator cannot oscillate at the frequencies of the next lower oscillation frequency(ies) and that it only oscillates at the frequency of the overtone to be generated.

Thus, in this crystal oscillator the overshoot in the amplitude characteristic in the range of the resonant frequency of the resonance amplifier is no longer utilized to generate the desired overtone in this range. It is rather the phase variation of the feedback loop and particularly that of the resonance amplifier which is used to cause the overtone crystal oscillator to oscillate at the frequency of the desired overtone. The phase variation which is required for this purpose and which is kept in the feedback loop by the signals will generally be performed advantageously by the resonance amplifier.

Essentially because of the resonance amplifier and for signals in the frequency range of the next lower oscillation frequency(ies) in relation to signals in the frequency range of the overtone to be generated such a resonance shift should be effected in the feedback loop that the overtone crystal oscillator cannot oscillate at the next lower oscillation frequencies and that the oscillation condition is no longer satisfied for these frequencies. On the other hand, for signal frequencies above the resonant frequency of the feedback loop or the resonance amplifier there is no phase shift or only a small phase shift of the signals so that the overtone crystal oscillator can oscillate at the frequency of the overtone to be generated and the oscillation condition is thus satisfied for this frequency.

The principal advantage of this overtone crystal oscillator is that the resonant frequency of the resonance amplifier should only satisfy the condition that it is between the frequency of the overtone to be generated and the next lower oscillation frequency of the crystal oscillator. However, this is a relatively extended frequency range so that an adjustment of the resonant frequency of the resonance amplifier is no longer necessary when there are relatively large component fluctuations and hence different resonant frequencies of the resonance amplifier. The overtone crystal oscillator is thus integrable without any problem. Moreover, a reliable suppression of the fundamental oscillation of the crystal oscillator results from the phase shift by approximately 180 degrees below the resonant frequency of the resonance amplifier.

According to a further embodiment of the invention signals in the frequency range of the overtone to be generated pass the resonance amplifier substantially without any phase shift and signals in the frequency range of the next lower oscillation frequency(ies) are subjected to a phase shift of approximately 180 degrees in the resonance amplifier. If the crystal oscillator is implemented in such a way that the oscillation condition for the desired overtone is fulfilled without using the resonance amplifier in the feedback loop, the resonance amplifier is advantageously formed in such a manner that above its resonant frequency it does not generate any phase shift of the signals passing through it. However, below the resonant frequency there is a phase shift by about 180 degrees so that the overtone crystal oscillator cannot oscillate in this frequency range.

According to a further embodiment of the invention only capacitances and ohmic resistors are provided as passive components for generating the resonance in the resonance amplifier. To generate the desired phase shift by 180 degrees, a simple RC network is sufficient so that the overtone crystal oscillator including this RC network can be easily integrated for the reasons described hereinbefore.

To suppress an oscillation of the overtone crystal oscillator on a next higher resonant frequency of the crystal oscillator with respect to the desired oscillation frequency, a further embodiment according to the invention is characterized in that the resonance amplifier and the feedback loop of the crystal oscillator have a gain at the next higher frequency relative to the frequency of the desired overtone such that an amplitude gain which is smaller than one is effected in the feedback loop for the next higher oscillation frequency.

A concrete embodiment of the overtone crystal oscillator according to the invention which can easily be realised is characterized in that an emitter-coupled crystal multivibrator comprising at least two transistors is arranged as a crystal oscillator and a differential amplifier with an RC network is arranged as a resonance amplifier, and in that the differential amplifier is arranged as a feedback network of the crystal multivibrator in such a way that a first input of the differential amplifier is connected to the collector of the first transistor and a first output is connected to the base of the second transistor and in that a second input of the differential amplifier is connected to the collector of the second transistor and a second output is connected to the base of the first transistor of the crystal multivibrator.

Figure 2:
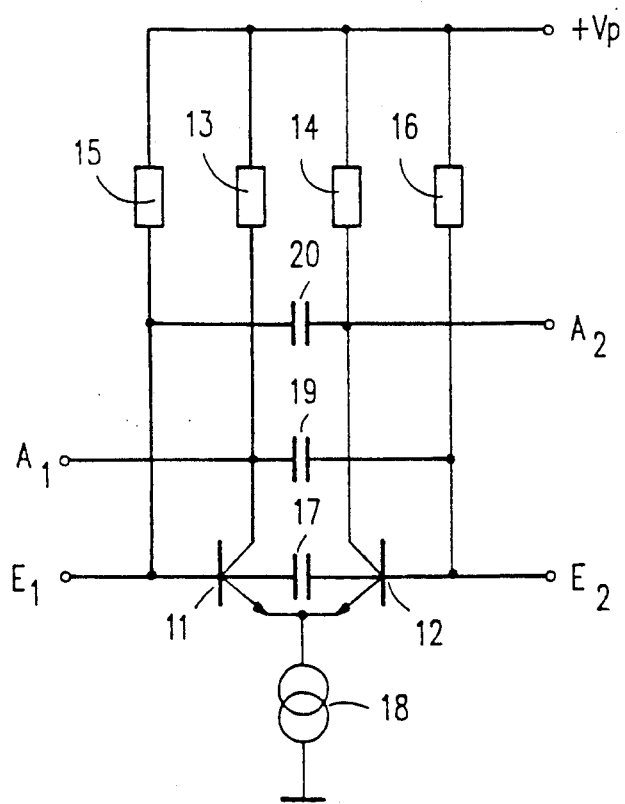
Figure 3:
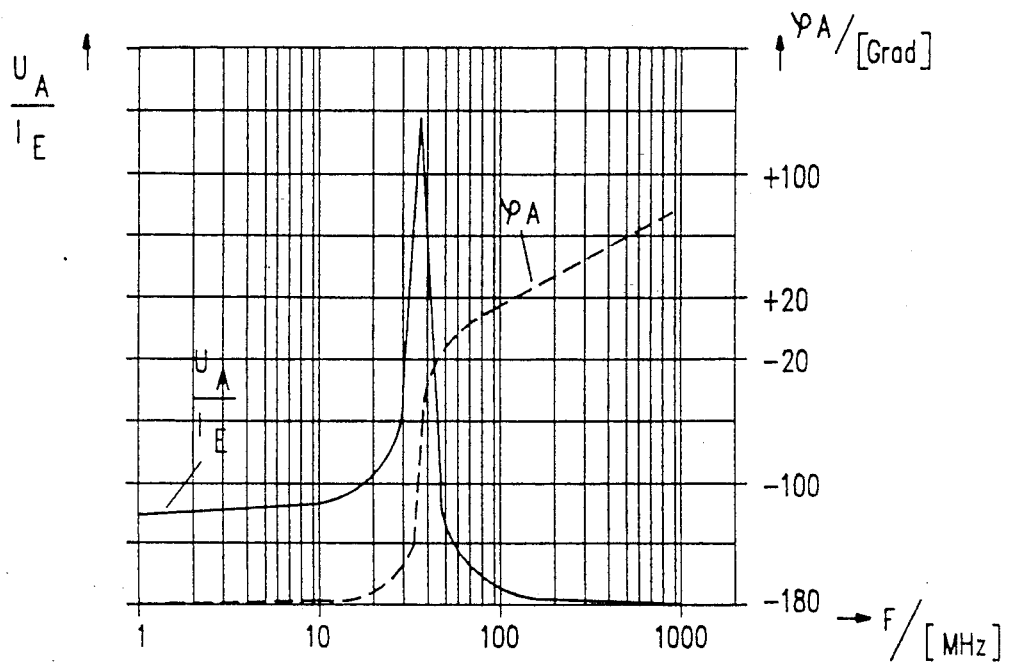
Figure 4:
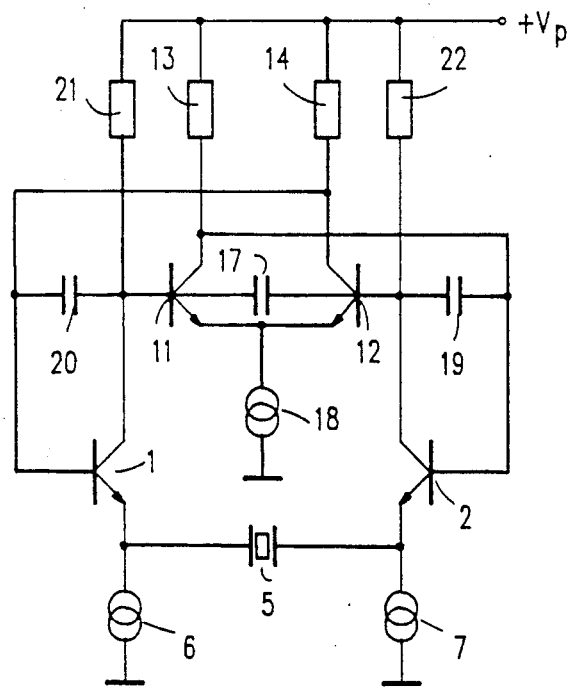

Embodiments of the invention will now be described in greater detail with reference to the accompanying drawings in which FIG. 1 shows an emitter-coupled crystal multivibrator, FIG. 2 shows a differential amplifier with an RC network which is used as a resonance amplifier, FIG. 3 shows the frequency versus amplitude and phase characteristic of the resonance amplifier of FIG. 2, and FIG. 4 shows an overtone crystal oscillator representing a combined arrangement of the crystal oscillator of FIG. 1 and the resonance amplifier of FIG. 2.

An emitter-coupled crystal multivibrator shown in FIG. 1 has two negatively fed-back transistors 1 and 2 whose collectors are connected to a positive power supply voltage $+V_p$ via ohmic resistors 3 and 4. The resistors 3 and 4 have the function of a frequency-independent feedback network. The base of the transistor 1 is connected to the collector of the transistor 2 and, conversely, the base of the transistor 2 is connected to the collector of transistor 1. A crystal 5 is arranged between the emitters of the two transistors 1 and 2. The two emitters of the transistors 1 and 2 are also connected to ground via current sources 6 and 7, respectively.

This emitter-coupled crystal multivibrator shown in FIG. 1 may be formed, for example, in such a manner that it oscillates at a fundamental frequency of 20 MHz. The crystal multivibrator may, however, also generate oscillations in the range of the odd harmonics. At a fundamental frequency of 20 MHz this would be 60 MHz for the third harmonic and 100 MHz for the fifth harmonic.

If, for example 60 MHz is to be generated as the desired overtone frequency, the crystal oscillator of FIG. 1 may be combined with a resonance amplifier shown in FIG. 2 in a manner to be described hereinafter.

The resonance amplifier shown in FIG. 2 is in the form of a differential amplifier having an RC network for generating the resonance.

The differential amplifier of FIG. 2 has two emitter-coupled transistors 11 and 12 The collectors of the two transistors 11 and 12 are connected to a positive power supply direct voltage $+V_P$ via resistors 13 and 14, respectively. The bases of the transistors 11 and 12 are connected to the same power supply voltage via resistors 15 and 16, respectively. The bases of the transistors 11 and 12 are coupled together via a capacitor 17. The coupled emitters of the transistors 11 and 12 are connected to ground via a current source 18.

The collector of the transistor 11 supplying the signal for a first output $A_1$ is connected via a coupling capacitor 19 to the base of the second transistor 12 which represents an input $E_2$. In a corresponding manner the collector of the transistor 12 supplying the signal for a second output $A_2$ is connected via a coupling capacitor 20 to the base of the transistor 11 which represents an input $E_1$.

The resonant frequency of this resonance amplifier shown in FIG. 2 is determined by the values of the capacitors 17, 19 and 20 and the resistors 13 and 14. If the resonance amplifier shown in FIG. 2 is to be combined with the crystal oscillator shown in FIG. 1 and if such an overtone crystal oscillator is to oscillate at the threefold frequency of the fundamental harmonic of the crystal oscillator shown in FIG. 1, the resonant frequency of the differential amplifier shown in FIG. 2 should be such that it is located between the fundamental harmonic and the third harmonic of the crystal oscillator shown in FIG. 1. In the above-chosen numerical example the resonant frequency should thus be in the range between 20 and 60 MHz. In order that oscillation of the crystal oscillator at its fundamental harmonic is certainly suppressed in this combined arrangement, the resonance amplifier shown in FIG. 2 has a phase characteristic which passes signals in the frequency range above its resonant frequency essentially without any phase shift, whereas signals in the frequency range below the resonant frequency of the resonance amplifier are phase shifted in phase by approximately 180 degrees.

These properties of the resonance amplifier shown in FIG. 2 are shown in greater detail in FIG. 3.

FIG. 3 shows the frequency versus amplitude characteristic of the resonance amplifier by means of a solid line and the phase characteristic by means of a broken line.

The amplitude characteristic of the resonance amplifier shown in FIG. 3 can be determined in such a manner that, not shown in FIG. 2, a current source has its two terminals connected to the inputs $E_1$ and $E_2$ of the resonance amplifier. An output voltage $U_A$ then occurs between the two outputs $A_1$ and $A_2$. The ratio of the current, which is impressed on the two inputs $E_1$ and $E_2$, with respect to the output voltage which occurs between the terminals $A_1$ and $A_2$ is shown as an amplitude characteristic in FIG. 3. In this amplitude characteristic an overshoot can be clearly recognized in the range around 38 MHz in FIG. 3. It is the resonant frequency of the resonance amplifier shown in FIG. 2.

In the range of this resonant frequency the phase characteristic $\phi_A$ of the resonance amplifier exhibits a distinct variation. The phase characteristic $\phi_A$ indicates the phase shift which occurs between the input signal and the output signal of the differential amplifier. It is clear from FIG. 3 that there is a phase shift of approximately 180 degrees below the resonant frequency of the resonance amplifier. This also holds for the frequency range of the fundamental harmonic at approximately 20 MHz of the crystal oscillator of FIG. 1. The resonant frequency of the resonance amplifier of FIG. 2 is set at 38 MHz, between the frequency of the fundamental frequency of the crystal oscillator of FIG. 1 and its third harmonic. In the range of the overtone frequency to be generated, which frequency represents the third harmonic in this case, i.e. at approximately 60 MHz, there is essentially no phase shift in the resonance amplifier, i.e. the phase characteristic $\phi_A$ has a value of approximately 0 degrees. Also in the frequency range of the next higher harmonic of the crystal oscillator, i.e. at approximately 100 there is only a small phase shift of the signals passing through the resonance amplifier.

Based on this embodiment of the resonance amplifier shown in FIG. 2 the condition is satisfied thai the signals in the frequency range of the overtone to be generated, which is the third harmonic at a frequency of approximately 60 MHz in this embodiment, the resonance amplifier generates hardly any phase shift of the signals passing through it. In the range of the next lower oscillation frequency, which in this case is the fundamental frequency at a frequency of approximately 20 MHz, the signals passing through the resonance amplifier are, however, phase shifted in phase by approximately 180 degrees so that oscillation of the crystal oscillator is suppressed in this range. The overtone crystal oscillator formed from the emitter-coupled crystal multivibrator of FIG. 1 and the resonance amplifier of FIG. 2 is shown in FIG. 4.

The overtone crystal oscillator shown in FIG. 1 has a feedback network including, inter alia, the resistors 3 and 4. It is a frequency-independent feedback network.

In the combination of the crystal multivibrator of FIG. 1 and the resonance amplifier of FIG. 2 shown in FIG. 4 the feedback network of the crystal multivibrator of FIG. 1 is omitted. The resonance amplifier of FIG. 2 is now used as a feedback network. To this end the resonance amplifier has its first input $E_1$ connected to the collector of the first transistor 1 of the crystal multivibrator. The output $A_1$ associated with the first input $E_1$ is connected to the base of the second transistor 2 of the crystal multivibrator. In a corresponding manner the second input $E_2$ of the resonance amplifier is connected to the collector of the second transistor 2 of the crystal multivibrator and the output $A_2$ associated with the second input $E_2$ is connected to the base of the first transistor 1 of the crystal multivibrator. The two resistors 3 and 4, as well as those connections between the two transistors 1 and 2 of the crystal multivibrator which each connect a base of one transistor to the collector of the other transistor have been omitted. The differential amplifier now replaces this feedback network.

The overtone crystal oscillator shown in FIG. 4 cannot oscillate in the range of the fundamental harmonic of its crystal oscillator because in this range the phase of the signals passing through the resonance amplifier in the feedback branch of the crystal oscillator is shifted by approximately 180 degrees. However, in the range of the third harmonic, i.e. at approximately 60 MHz, the overtone crystal oscillator of FIG. 4 can oscillate because in this range the feedback signals pass through the differential amplifier substantially without any phase shift, while moreover their levels are not very much attenuated.

In the range of the next harmonic, which is at approximately 100 MHz, the signals passing through the resonance amplifier exhibit a small phase shift, but in this frequency range the amplitude of the signals leaving the resonance amplifier is so small that the overtone crystal oscillator no longer oscillates when it is dimensioned accordingly.

Thus it is ensured that the overtone crystal oscillator shown in FIG. 4 can exclusively at its third harmonic at 60 MHz.

I claim:

1. An overtone crystal oscillator comprising a crystal oscillator having a feedback loop and a resonance amplifier whose amplitude characteristic has an overshoot in the range of the resonant frequency of the resonance amplifier and which is arranged in the feedback loop of the crystal oscillator, characterized in that the resonant frequency of the resonance amplifier is between the frequency of the overtone to be generated and the next lower oscillation frequency of the crystal oscillator and in that signals in the frequency range of the next lower oscillation frequency(ies) in relation to signals in the frequency range of the overtone to be generated in the feedback loop, particularly in the resonance amplifier, have such a phase shift that the overtone crystal oscillator cannot oscillate at the frequencies of the next lower oscillation frequency(ies) and that it only oscillates at the frequency of the overtone to be generated.

2. An overtone crystal oscillator as claimed in claim 1, characterized in that signals in the frequency range of the overtone to be generated pass the resonance amplifier substantially without any phase shift and signals in the frequency range of the next lower oscillation frequency(ies) are subjected to a phase shift of approximately 180 degrees in the resonance amplifier.

3. An overtone crystal oscillator as claimed in claim 1, characterized in that the overtone to be generated is the third harmonic of the crystal oscillator and in that the resonant frequency of the resonance amplifier is between the fundamental frequency and the third harmonic of the crystal oscillator.

4. An overtone crystal oscillator as claimed in claim 1, characterized in that only capacitances (17) and ohmic resistors (13, 14) are provided as passive components for generating the resonance in the resonance amplifier.

5. An overtone crystal oscillator as claimed in claim 1, characterized in that the resonance amplifier and the feedback loop of the crystal oscillator have a gain at the next higher harmonic frequency relative to the frequency of the desired overtone such that an amplitude gain which is smaller than one is effected in the feedback loop for the next higher oscillation frequency.

6. An overtone crystal oscillator as claimed in claim 1, characterized in that an emitter-coupled crystal multivibrator comprising at least two transistors is arranged as a crystal oscillator and a differential amplifier with an RC network is arranged as a resonance amplifier, and in that the differential amplifier is arranged as a feedback network of the crystal multivibrator in such a way that a first input of the differential amplifier is connected to the collector of the first transistor and a first output is connected to the base of the second transistor and in that a second input of the differential amplifier is connected to the collector of the second transistor and a second output is connected to the base of the first transistor of the crystal multivibrator.

7. An overtone crystal oscillator as claimed in claim 2, characterized in that the overtone to be generated is the third harmonic of the crystal oscillator and in that the resonant frequency of the resonance amplifier is between the fundamental frequency and the third harmonic of the crystal oscillator.

* * * * *